United States Patent
Chun

(10) Patent No.: US 7,248,535 B2
(45) Date of Patent: Jul. 24, 2007

(54) SEMICONDUCTOR MEMORY DEVICES HAVING NEGATIVELY BIASED SUB WORD LINE SCHEME AND METHODS OF DRIVING THE SAME

(75) Inventor: Ki-Chul Chun, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/344,018

(22) Filed: Jan. 31, 2006

(65) Prior Publication Data
US 2006/0176758 A1    Aug. 10, 2006

(30) Foreign Application Priority Data
Feb. 4, 2005    (KR)    ........................ 10-2005-0010372

(51) Int. Cl.
*G11C 8/00* (2006.01)
*G11C 7/00* (2006.01)

(52) U.S. Cl. .................... 365/230.03; 365/230.06; 365/189.11

(58) Field of Classification Search ............ 365/63, 365/230.03, 230.06, 194, 203, 189.11
See application file for complete search history.

(56) References Cited

U.S. PATENT DOCUMENTS

| | | | |
|---|---|---|---|
| 4,821,234 A | 4/1989 | Nakase ...................... 365/203 |
| 5,406,526 A * | 4/1995 | Sugibayashi et al. ... 365/230.03 |
| 5,650,976 A | 7/1997 | McLaury ............... 365/230.06 |
| 5,856,952 A * | 1/1999 | Yoo et al. .............. 365/230.06 |
| 5,940,343 A * | 8/1999 | Cha et al. .............. 365/230.06 |
| 5,986,917 A * | 11/1999 | Lee ....................... 365/230.06 |
| 6,069,838 A * | 5/2000 | Jeong .................... 365/230.06 |
| 6,111,808 A * | 8/2000 | Khang et al. .......... 365/230.06 |
| 6,181,636 B1 * | 1/2001 | Lee et al. .............. 365/230.06 |
| 6,201,745 B1 * | 3/2001 | Ryu et al. .............. 365/230.06 |
| 6,510,094 B2 * | 1/2003 | Chung et al. .......... 365/230.03 |
| 6,545,923 B2 * | 4/2003 | Sim et al. .............. 365/230.06 |
| 6,845,049 B2 * | 1/2005 | Lim et al. ................... 365/194 |
| 6,973,007 B2 * | 12/2005 | Kim ....................... 365/230.06 |

FOREIGN PATENT DOCUMENTS

| | | |
|---|---|---|
| JP | 10241361 | 9/1998 |
| KR | 1020000045870 | 7/2000 |
| KR | 1020010059020 | 7/2001 |
| KR | 1020040022090 | 3/2004 |

* cited by examiner

Primary Examiner—Trong Phan
(74) Attorney, Agent, or Firm—Myers Bigel Sibley & Sajovec, PA

(57) ABSTRACT

Semiconductor memory devices having a negatively biased sub-word line scheme and methods of driving the same are disclosed. In a semiconductor memory device, NMOS transistors for pulling down a word line enable signal and a word line driving signal to a negative voltage are adjusted to a negative voltage. The negatively biased word line scheme may decrease influx of discharge current into the negative voltage source and decrease negative voltage fluctuations and associated noise.

23 Claims, 12 Drawing Sheets

SEMICONDUCTOR MEMORY DEVICES HAVING NEGATIVELY BIASED SUB WORD LINE SCHEME AND METHODS OF DRIVING THE SAME

CROSS REFERENCE TO RELATED APPLICATION

This application claims priority from Korean Patent Application No. 10-2005-0010372, filed on Feb. 4, 2005 in the Korean Intellectual Property Office, the disclosure of which is incorporated herein in its entirety by reference.

FIELD OF THE INVENTION

The present invention relates generally to semiconductor memory devices, and more particularly, to semiconductor memory devices having a negative word line driver and methods of driving the same.

BACKGROUND OF THE INVENTION

FIG. 1 illustrates a conventional memory cell in a Dynamic Random Access Memory (DRAM). The memory cell includes a transistor M1 and a cell capacitor connected in series between a bit line and a voltage VP. A gate of the transistor M1 is connected to a word line. The refresh time of the DRAM memory cell is decreased by two major types of leakage current: I1 which is junction leakage current caused by defects at the junction boundary of transistor M1; and I2 which is channel leakage current caused by sub-threshold current flowing through the transistor M1.

The junction leakage current I1 can be reduced by decreasing the channel implantation dose, but this can cause I2 to increase. Similarly, the sub-threshold current I2 can be reduced by increasing the threshold voltage Vth of M1, but this can cause I1 to increase.

A negatively biased word line scheme has been devised to reduce both junction leakage current and channel leakage current at the same time. A memory device employing a negative word line scheme applies a negative voltage VBB (typically −0.4 to −0.5 Volts) to the word lines of non-selected memory cells.

The memory devices employing negatively biased word line schemes, however, can be subject to noise problems. Noise can be generated by the influx of discharge current into a negative voltage source. That is, the influx of discharge current into the negative voltage source occurs when a word line is discharged from a boosting voltage or supply voltage to a negative voltage during a precharge operation. When these discharge currents are excessively high, noise occurring in the negative voltage VBB increases and may cause the semiconductor memory device to operate erroneously.

SUMMARY OF THE INVENTION

In one embodiment of the present invention, a semiconductor memory device includes a plurality of sub-word lines, a plurality of sub-word line drivers, driving signal generating circuits and word line enable drivers. The sub-word line drivers are connected to corresponding sub-word lines, and connect the corresponding sub-word lines to a first voltage in response to corresponding word line enable signals and sub-word line driving signals during a precharge operation. The driving signal generating circuits provide the sub-word line driving signals to corresponding sub-word line drivers, respectively. The word line enable drivers provide the word line enable signals to corresponding sub-word line drivers; respectively. Each of the word line enable drivers includes a decoder input terminal for receiving an upper decoding signal, a predetermined decoder control terminal, a first decoder pull-down unit for pulling down the decoder control terminal to a second voltage in response to the upper decoding signal and a predetermined leakage interruption signal, a second decoder pull-down unit for pulling down the decoder control terminal to the first voltage in response to a predetermined preliminary signal that is used to generate the word line enable signals, a decoder pull-up unit for pulling up the decoder control terminal in response to the upper decoding signal, and a driving unit for generating the preliminary signal pulled down to the first voltage in response to the decoder control terminal. The leakage interruption signal is adjusted to the first voltage when each word line enable signal is activated.

In another embodiment of the present invention, a semiconductor memory device includes a plurality of sub-word lines, a plurality of sub-word line drivers, driving signal generating circuits and word line enable drivers. Each of the driving signal generating circuits includes a driving input terminal for receiving a lower decoding signal, a driving output terminal for outputting a corresponding sub-word line driving signal, a first driving pull-down unit connected to the driving output terminal and used to pull down the driving output terminal to a second voltage in response to the lower decoding signal, a second driving pull-down unit for pulling down the driving output terminal to the first voltage in response to a predetermined driving control signal that responds to the lower decoding signal, and a driving control unit for adjusting the driving control signal to the first voltage in response to pull-up of the driving output terminal so as to at least substantially inhibit leakage current caused by the second driving pull-down unit.

In another embodiment of the present invention, a method of driving a semiconductor memory device including at least one sub-word line driver for connecting a corresponding sub-word line to a first voltage in response to a word line enable signal and a sub-word line driving signal. The driving method includes the steps of a driving signal generating circuit generating the sub-word line driving signal and providing the sub-word line driving signal to a corresponding sub-word line driver through a driving output terminal, the driving signal generating circuit having a driving input terminal and the driving output terminal, and a word line enable driver generating a pulled down word line enable signal in response to a decoder control terminal and providing the word line enable signal to a corresponding sub-word line driver, the word line enable driver having a decoder input terminal and the decoder control terminal. The word line enable signal generation step includes the steps of receiving an upper decoding signal through the decoder input terminal, pulling down the decoder control terminal to a second voltage in response to the upper decoding signal and a predetermined leakage interruption signal, and pulling down the decoder control terminal to the first voltage in response to a predetermined preliminary signal that is used to generate the word line enable signal, and generating the preliminary signal pulled down to the first voltage in response to the decoder control terminal. The leakage interruption signal is adjusted to the first voltage when each word line enable signal is activated.

In another embodiment of the present invention, a method of driving a semiconductor memory device including at least one sub-word line driver for connecting a corresponding sub-word line to a first voltage in response to a word line enable signal and a sub-word line driving signal. The driving method includes the steps of generating a sub-word line driving signal and generating a word line enable signal. The sub-word line driving signal generation step includes the steps of receiving a lower decoding signal, pulling down the sub-word line driving signal to a second voltage in response to the lower decoding signal, and pulling down the sub-word line driving signal to the first voltage in response to a predetermined driving control signal. The driving control signal is adjusted to the first voltage in response to pull-up of the driving output terminal.

BRIEF DESCRIPTION OF THE DRAWINGS

FIGS. 3 and 4 are diagrams showing examples of the sub-word line driver of FIG. 2, in which FIG. 3 illustrates a conventional NMOS-type sub-word line driver and FIG. 4 illustrates a conventional CMOS-type sub-word line driver;

DETAILED DESCRIPTION OF EMBODIMENTS OF THE INVENTION

Certain embodiments of the present invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used herein is for the purpose of describing particular embodiments only and is not intended to be limiting of the invention. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In this specification, a negative voltage VBB and a ground voltage VSS can be called 'first voltage' and 'second voltage', respectively.

Figure 1:
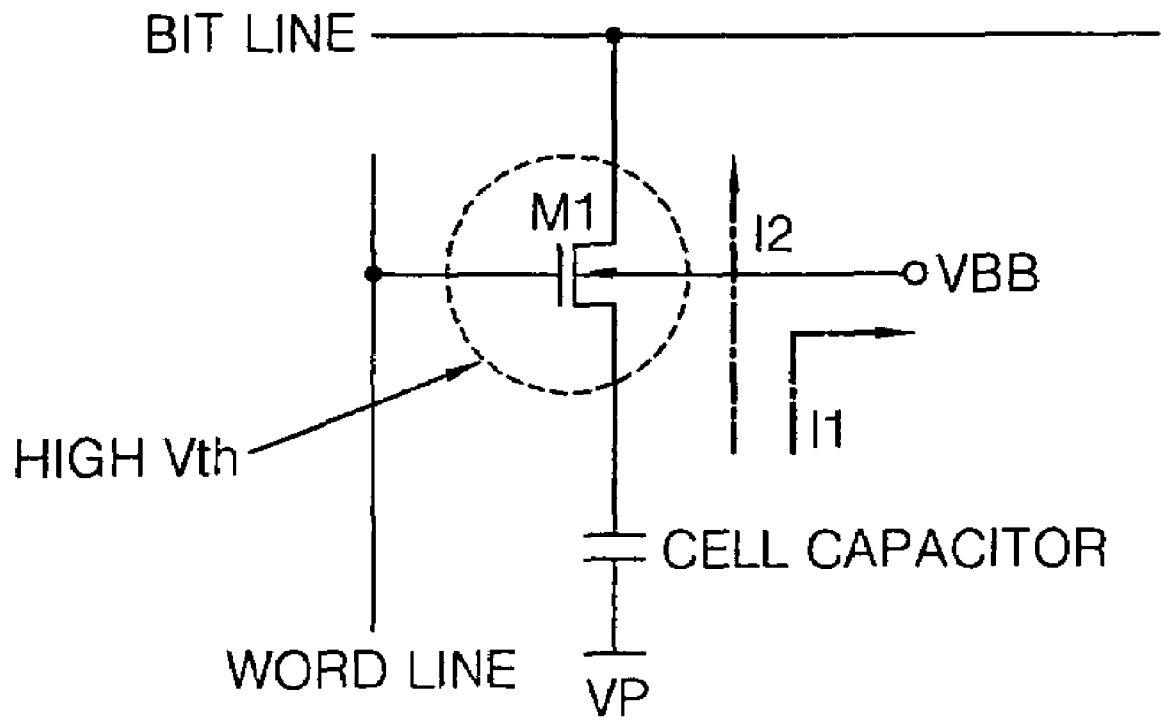
FIG. 1 illustrates a conventional memory cell in a DRAM.
Figure 2:
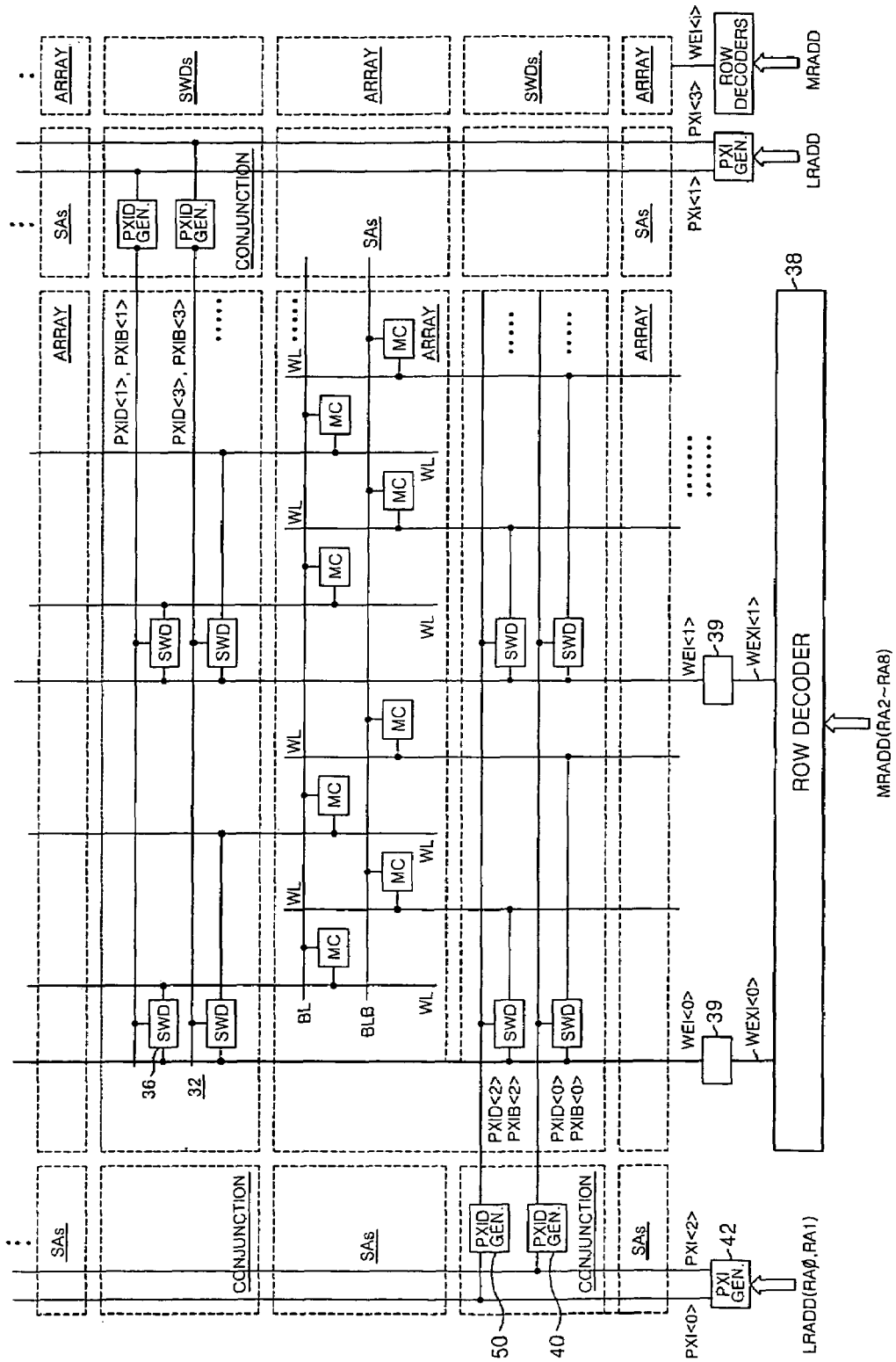
FIG. 2 illustrates the core structure of a semiconductor memory device utilizing a conventional sub-word line driver scheme.

FIG. 2 illustrates a core structure of a conventional prior art DRAM device utilizing a sub-word line driver scheme. The core structure may be used in a semiconductor memory device according to some embodiments of the present invention. As shown in FIG. 2, the core structure includes memory cell arrays ARRAY, sense amplifier blocks SAs, sub-word line blocks 32, a row decoder 38, a word line enable driver 39, and a conjunction area CONJUNCTION. In the conjunction area CONJUNCTION, driving signal generating circuits 40 and 50 are implemented to supply a boosting voltage VPP to word lines.

Within each memory cell array ARRAY, are individual memory cells MC, each having a cell transistor and cell capacitor located at the intersection of a bit line BL/BLB and a sub-word line WL.

The sub-word lines WL are driven by sub-word line drivers 36 located within sub-word line driver blocks 32. Each of the sub-word line drivers 36 is controlled by one of the word line enable signals WEI from the row decoder 38 and one of sub-word line driving signals PXID which are types of word lines that are distributed throughout the semiconductor memory device as described below.

The row decoder 38 generates word line enable signals WEI in response to the upper row address bits MRADD (RA2 to RA8 in the present embodiment). The upper row address bits MRADD are buffered by word line enable drivers 39 which are shown outside of the decoder 38, but can also be inside the decoder.

Each word line enable driver 39 supplies respective word line enable signal WEI<i> to a corresponding sub-word line driver 36. That is, the word line enable driver 39 decodes the upper row address bits MRADD to select one of word line enable signals WEI<i>. The selected word line enable signal WEI is activated to the VPP level.

Each driving signal generating circuit 40 or 50 supplies respective sub-word line driving signal PXID to a corresponding sub-word line driver 36.

Lower decoding signal generating circuits 42 receive and decode lower row address bits LRADD (RA0 and RA1 in the present embodiment) and generate four lower decoding signals PXI<j> (where j is 0 to 3). These lower decoding signals PXI<j> are distributed throughout the memory device by a word line drive circuit. The lower decoding signals PXI<j> drive the driving signal generating circuits 40 and 50 which are typically located in the conjunction area CONJUNCTION. The PXID generating circuits 40 and 50, in turn, drive the PXID/PXIB lines which are complementary signal lines that drive the sub-word line drivers 36.

When a memory cell is accessed, the corresponding word line enable signals WEI and PXID/B signals are activated. This causes the corresponding sub-word line driver SWD 36 to drive the corresponding sub-word line to VPP. After the access operation is completed, the sub-word line driver precharges the sub-word line WL to the negative voltage VBB through the ground voltage VSS. Distributing the PX lines and word line driver circuits throughout the device allows the memory device to operate at higher speeds.

Figure 3:
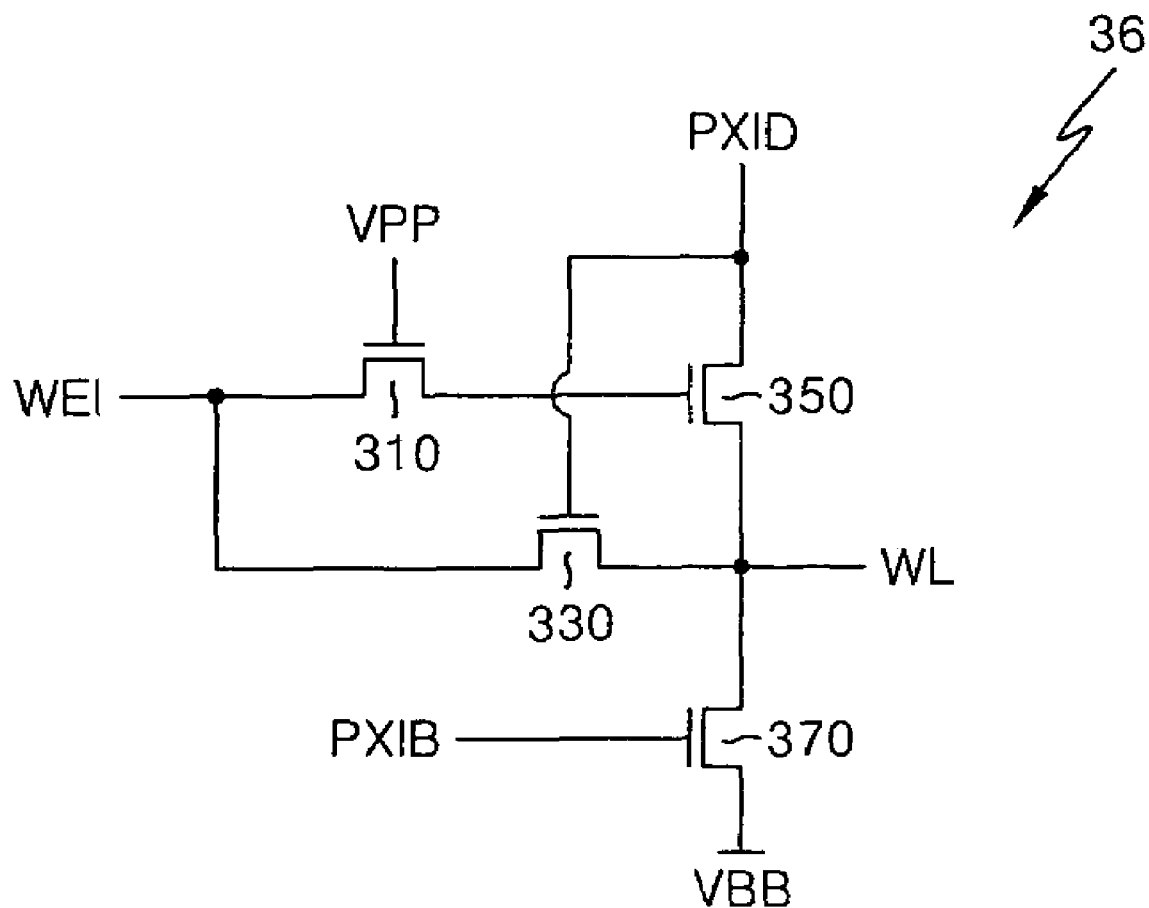
Figure 4:
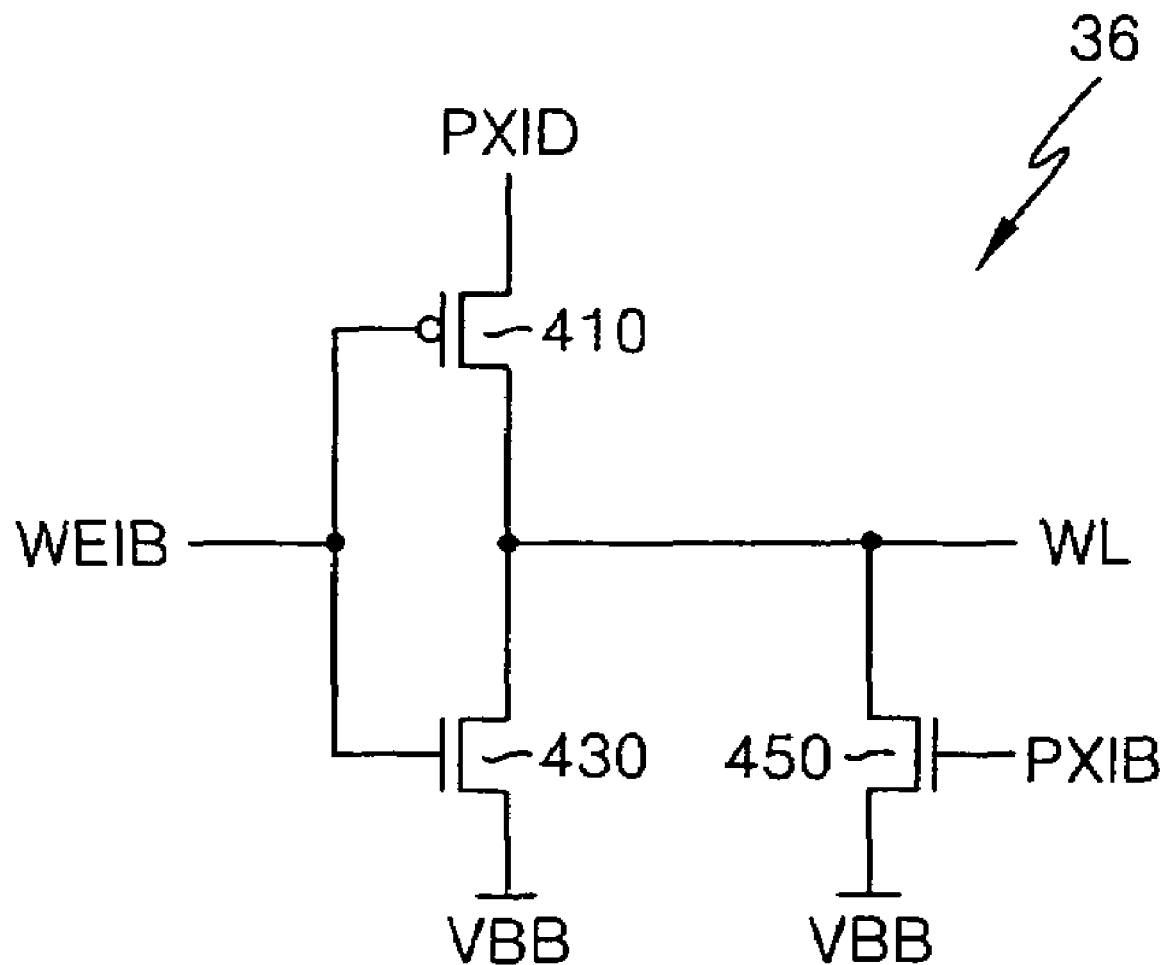

FIG. 3 illustrates a typical prior art NMOS-type sub-word line driver, and FIG. 4 illustrates a typical prior art CMOS-type sub-word line driver. Here, the phase of a signal PXIB is the opposite of that of the lower decoding signal PXI. The lower decoding signal PXI may be activated to the VPP level. The phase of the signal WEIB is the opposite of that of the word line enable signal WEI.

The subword line driver 36 of FIG. 3 includes four transistors 310, 330, 350, and 370. The transistors 350 and 370 are connected in series between a sub-word line driving signal PXID and a VBB voltage level. The signal PXIB is connected to a gate of the transistor 370. The transistor 330 is connected between a word line enable signal WEI and a write line WL. The write line WL is connected to a node between the transistors 350 and 370. The transistor 310 is connected between the word line enable signal WEI and a gate of the transistor 350. A VPP voltage is applied to the gate of the transistor 310. A gate of the transistor 330 is connected to the sub-word line driving signal PXID.

The subword line driver 36 of FIG. 4 includes three transistors 410, 430, and 450. The transistors 410 and 430 are connected in series between a sub-word line driving signal PXID and a VBB voltage level. A signal WEIB is applied to a gate to the transistor 430, and an inverse of the signal WEIB is applied to a gate of the transistor 410. The transistor 450 is connected to a word line WL and to the VBB voltage level. The word line WL is also connected to a node between the transistors 410 and 430. A signal PXIB is connected to a gate to the transistor 450.

Therefore, the sub-word line driver 36 of FIGS. 3 and 4 drives the sub word line WL to the VPP level in response to the lower decoding signal PXI and the word line enable signal WEI.

Further, the sub-word line driver of FIGS. 3 and 4 is connected to the corresponding sub-word line WL, and connects the sub-word line WL to the negative voltage VBB in response to the word line enable signal WEI and the sub-word line driving signal PXID during a precharge operation.

Figure 5:
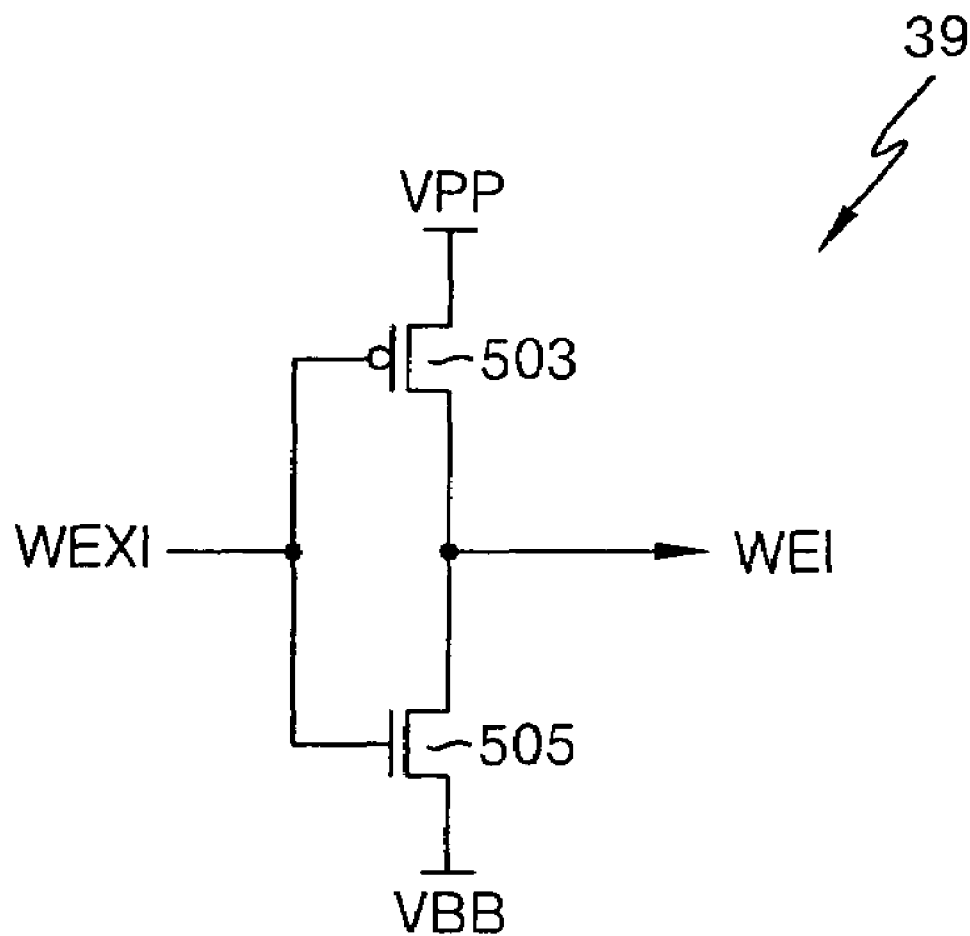
FIG. 5 illustrates an example of the implementation of a word line enable driver of FIG. 2.
Figure 6:
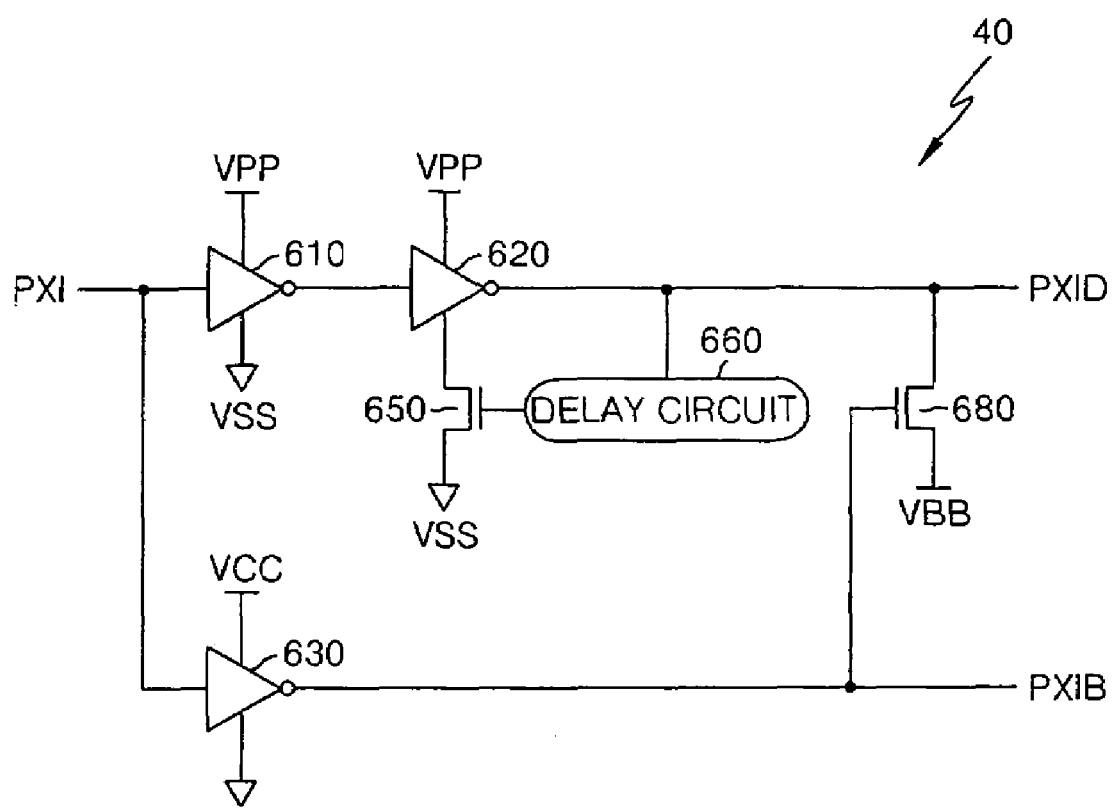
FIG. 6 illustrates an example of the implementation of a driving signal generating circuit of FIG. 6.

FIG. 5 illustrates an example of the implementation of the word line enable driver 39 of FIG. 2, and FIG. 6 illustrates an example of the implementation of the driving signal generating circuits 40 and 50. Referring to FIG. 5, the word line enable driver 39 includes a PMOS transistor 503 and an NMOS transistor 505.

If a word line enable signal WEI is selected by an upper decoding signal WEXI at the time of active operation of the semiconductor memory device, the word line enable signal WEI is pulled up to a boosting voltage VPP by the PMOS transistor 503. In this case, the upper decoding signal WEXI is a signal decoded by an upper row address MRADD. The word line enable signal WEI is pulled up to the boosting voltage VPP by the PMOS transistor 503.

Further, the word line enable signal WEI is discharged to a negative voltage VBB by the NMOS transistor 505.

Referring to FIG. 6, the driving signal generating circuit 40 includes a plurality of inverters 610, 620 and 630, two transistors 650 and 680, and a delay circuit 660.

The supply voltage VCC is the supply voltage applied to a memory cell array and has a high level. If a lower decoding signal PXI makes the transition from low to high, the output signal PXID of the inverter 620 is changed to the VPP level. In this case, the sub-word line WL of FIGS. 3 and 4 is also changed to the VPP level in response to an activated word line enable signal WEI.

If the lower decoding signal PXI makes the transition from high to low, the output signal PXID of the inverter 620 decreases from a high to low level. If the output signal PXID of the inverter 620 is higher than the threshold voltage of the transistor 650, most of the current flowing through the output terminal of the inverter 620 is discharged to the ground voltage VSS through the transistor 650. In this case, the output terminal of the inverter 620 discharges a small amount of current to the negative voltage VBB through the transistor 680 having a high threshold voltage.

By the delay circuit 660 connected to the gate of the transistor 650, current flowing through the output terminal of the inverter 620 is discharged to the ground voltage VSS through the transistor 650 until the output signal PXID of the inverter 620 becomes about "0". If the transistor 650 is turned off, the voltage of the output signal PXID of the inverter 620 changes to the level of the negative voltage VBB through the transistor 680.

That is, the output signal PXID of the inverter 620 is discharged to the negative voltage VBB through the ground voltage VSS. Therefore, fluctuations in the negative voltage VBB according to the current flowing through the transistor 680 may decrease.

However, if the operating voltage of the semiconductor memory device decreases, the possibility of malfunction of the embodiments of FIGS. 5 and 6 may increase. That is, as the operating voltage of the semiconductor memory device decreases, the transistor 680 is required to have a low threshold voltage to facilitate the discharge of the output signal of the inverter 620. In this case, at the time of active operation of activating the sub-word line WL, leakage current may occur through the transistor 680 between the boosting voltage VPP and the negative voltage VBB. Further, the threshold voltage of the NMOS transistor 505 in FIG. 5 also decreases, and leakage current may occur through the transistor 503 between the boosting voltage VPP and the negative voltage VBB at the time of active operation. Therefore, noise may occur in the boosting voltage VPP and the negative voltage VBB. Further, there is a problem in that, in order to control the threshold voltage of the NMOS transistor 505 of FIG. 5 and the NMOS transistor 680 of FIG. 6, a separate impurity doping process is required, thus increasing the number of manufacturing stages. Further, there are some manufacturing processes causing difficulty in suitably controlling the threshold voltage of the NMOS transistor 505 of FIG. 5 and the NMOS transistor 680 of FIG. 6 even when using the impurity doping process (for example, a FinFET process).

Figure 7:
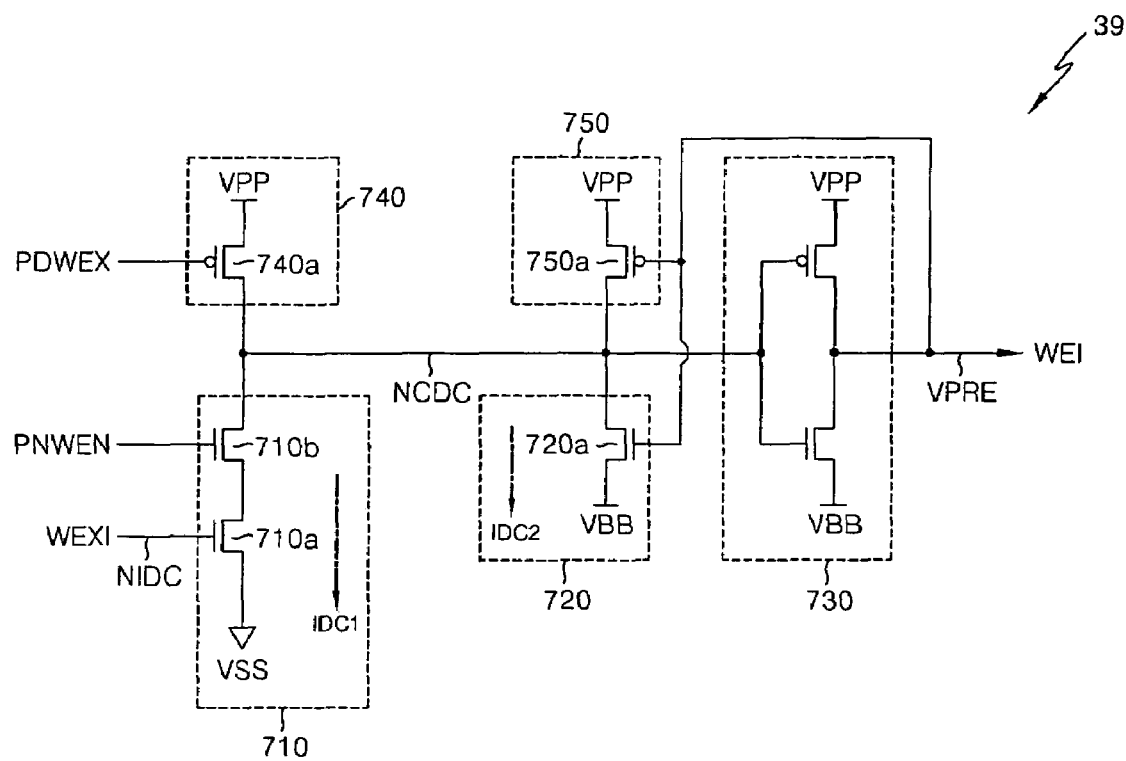
FIG. 7 illustrates an example of a word line enable driver applied to a semiconductor memory device according to an embodiment of the present invention.

FIG. 7 illustrates an example of a word line enable driver 39 applied to a semiconductor memory device according to an embodiment of the present invention. Referring to FIG. 7, a word line enable driver 39 for providing a word line enable signal WEI to a corresponding sub-word line driver 36 includes a decoder input terminal NIDC, a decoder control terminal NCDC, a first decoder pull-down unit 710, a second decoder pull-down unit 720, a driving unit 730, a decoder pull-up unit 740 and a pull-up maintaining unit 750.

An upper decoding signal WEXI is input through the decoder input terminal NIDC.

The first decoder pull-down unit 710 pulls down the decoder control terminal NCDC to a ground voltage VSS in response to the upper decoding signal WEXI and a predetermined leakage interruption signal PNWEN. The leakage interruption signal PNWEN is adjusted to a negative voltage VBB when the word line enable signal WEI is activated. Preferably, the first decoder pull-down unit 710 includes two NMOS transistors 710a and 710b connected between the ground voltage VSS and the decoder control terminal NCDC. The NMOS transistor 710a is gated by the upper decoding signal WEXI. The NMOS transistor 710b is gated by the leakage interruption signal PNWEN. Therefore, when the voltage of the decoder control terminal NCDC decreases to the ground voltage VSS or less, leakage current caused by the NMOS transistor 710b decreases.

The first decoder pull-down unit 710 forms a first decoder current path IDC1 between the decoder control terminal NCDC and the ground voltage VSS in response to the upper decoding signal WEXI and the leakage interruption signal PNWEN. Therefore, the decoder control terminal NCDC is pulled down to the ground voltage VSS by the first decoder pull-down unit 710 at the time of a pull-down operation.

The second decoder pull-down unit 720 pulls down the decoder control terminal NCDC to the negative voltage VBB in response to a preliminary signal VPRE. The preliminary signal VPRE ultimately generates the word line enable signal WEI. In the word line enable driver 39 of FIG. 7, the preliminary signal VPRE is equal to the word line enable signal WEI. Preferably, the second decoder pull-down unit 720 includes an NMOS transistor 720a that is connected between the decoder control terminal NCDC and the negative voltage VBB and is gated by the preliminary signal VPRE. The second decoder pull-down unit 720 forms a second decoder current path IDC2 between the decoder control terminal NCDC and the negative voltage VBB in response to the preliminary signal VPRE. Therefore, the decoder control terminal NCDC is pulled down to the negative voltage VBB by the second decoder pull-down unit 720 at the time of a pull-down operation.

The driving unit 730 generates the preliminary signal VPRE pulled down to the negative voltage VBB in response to the decoder control terminal NCDC. Preferably, the driving unit 730 is implemented with an inverter connected between the boosting voltage VPP and the negative voltage VBB. Therefore, the preliminary signal VPRE swings between the boosting voltage VPP and the negative voltage VBB.

The decoder pull-up unit 740 pulls up the decoder control terminal NCDC to the boosting voltage VPP in response to a delayed boosting decoding signal PDWEX. The delayed boosting decoding signal PDWEX is delayed from the upper decoding signal WEXI by a predetermined time, and swings between the ground voltage VSS and the boosting voltage VPP. Consequently, the decoder pull-up unit 740 responds to the upper decoding signal WEXI. Preferably, the decoder pull-up unit 740 includes a PMOS transistor 740a that is connected between the decoder control terminal NCDC and the boosting voltage VPP and is gated by the delayed boosting decoding signal PDWEX. Therefore, the decoder control terminal NCDC is pulled up to the boosting voltage VPP by the decoder pull-up unit 740.

The pull-up maintaining unit 750 maintains the pull-up of the decoder control terminal NCDC at the boosting voltage VPP in response to the preliminary signal VPRE. Preferably, the pull-up maintaining unit 750 includes a PMOS transistor 750a connected between the decoder control terminal NCDC and the boosting voltage VPP. Accordingly, when the decoder control terminal NCDC is pulled up to the boosting voltage VPP, the decoder control terminal NCDC is maintained at the boosting voltage VPP by the PMOS transistor 750a that is gated by the preliminary signal VPRE adjusted to the negative voltage VBB.

Figure 8:
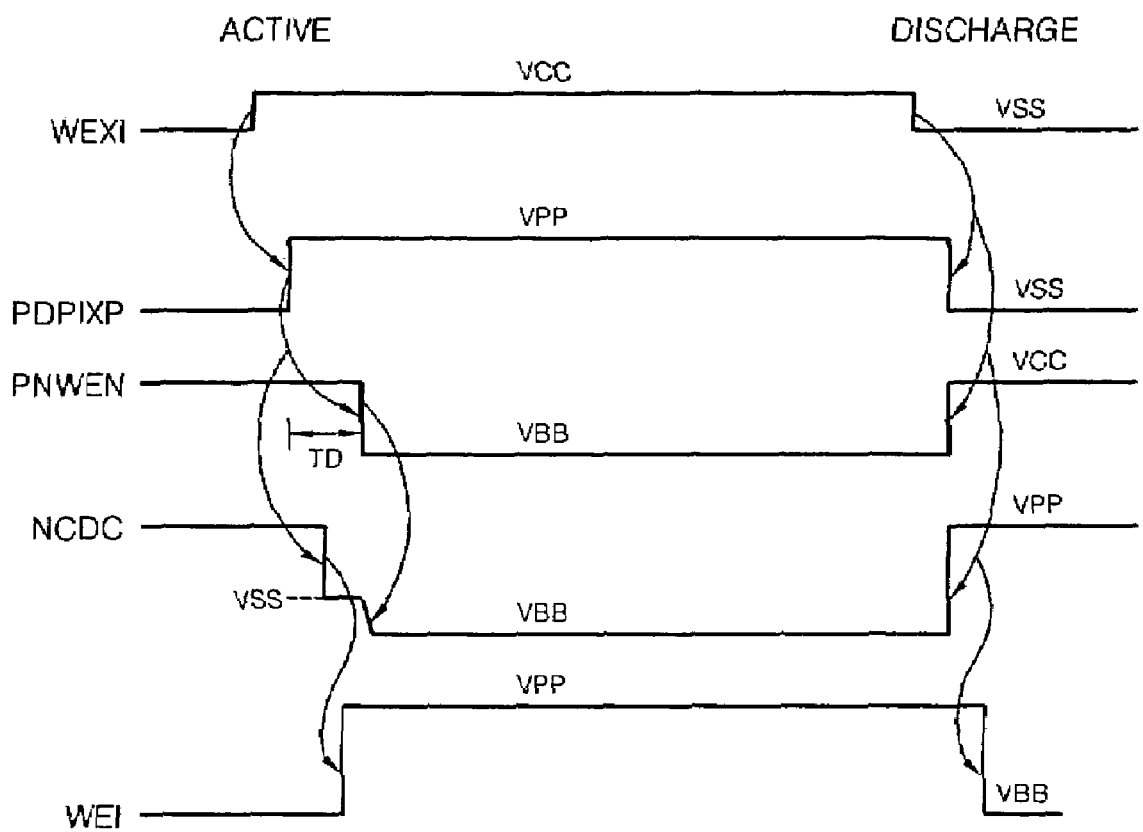
FIG. 8 is a timing diagram of the word line enable driver of FIG. 7.

FIG. 8 is a timing diagram of the word line enable driver 39 of FIG. 7. With reference to FIGS. 3, 4, 7 and 8, the operation of the word line enable driver 39 is described in detail.

If the upper decoding signal WEXI makes the transition from the ground voltage VSS to the supply voltage VCC, the word line enable signal WEI makes the transition from the negative voltage VBB to the boosting voltage VPP via the use of the first decoder pull-down unit 710 and the driving unit 730. Therefore, the sub-word line WL of the sub-word line WL of the sub-word line driver 36 in FIG. 3 or 4 is pulled up to the boosting voltage VPP in response to an activated sub-word line driving signal PXID or deactivated PXIB. At this time, the leakage interruption signal PNWEN is adjusted to the negative voltage VBB. Therefore, leakage current caused by the first decoder pull-down unit 710 does not occur.

In this case, at the time of activating the word line enable signal WEI, a transition of the leakage interruption signal PNWEN to the negative voltage VBB occurs later than a transition of the delayed boosting decoding signal PDWEX to the boosting voltage VPP by a predetermined control time TD. The reason for this is to provide sufficient time to pull down the decoder control terminal NCDC to the ground voltage VSS.

If the upper decoding signal WEXI makes the transition from the supply voltage VCC to the ground voltage VSS, the word line enable signal WEI is decreased to the negative voltage VBB by the decoder pull-up unit 740 and the driving unit 730.

Figure 9:
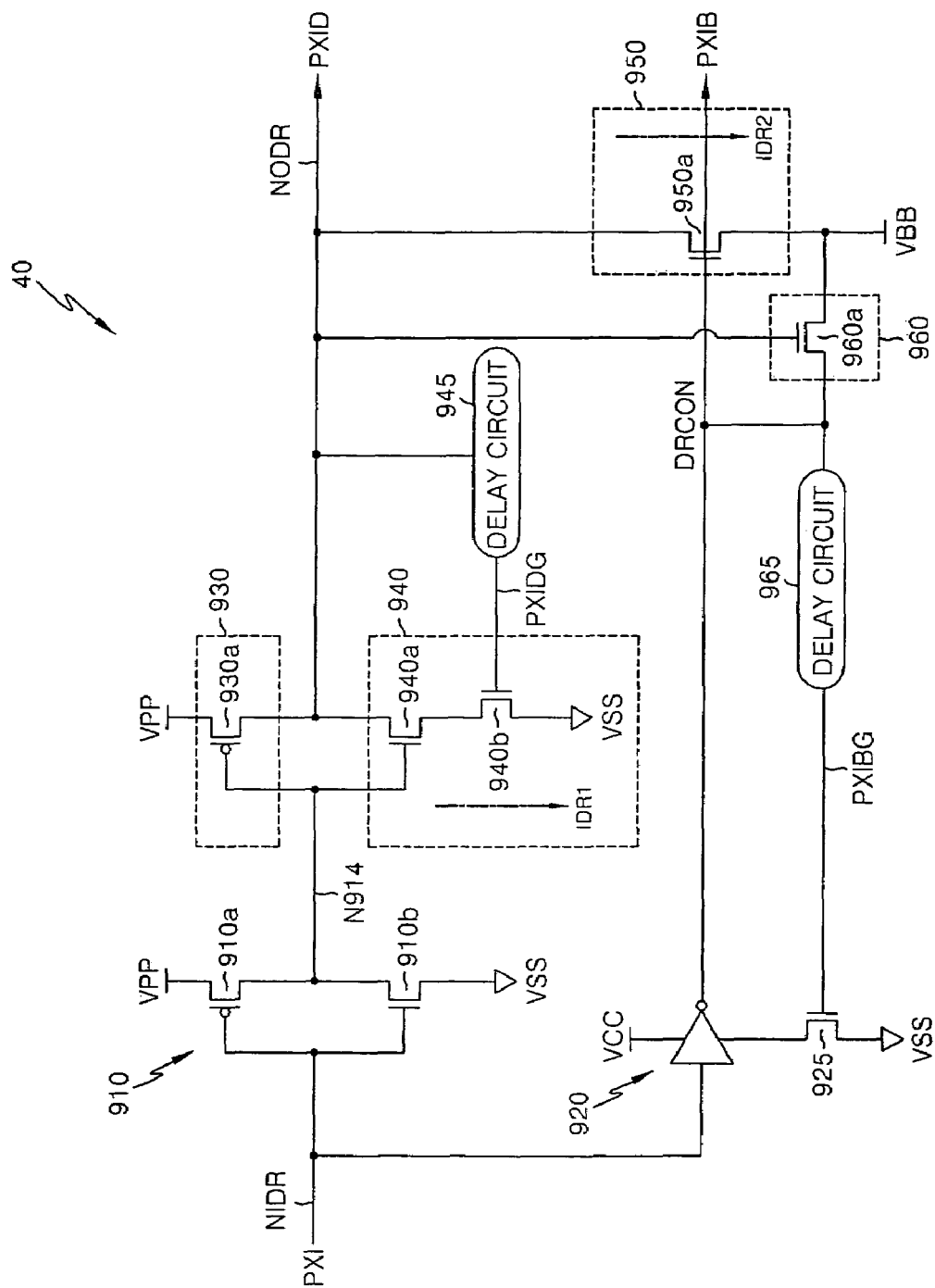
FIG. 9 illustrates an example of a driving signal generating circuit applied to the semiconductor memory device according to the embodiment of the present invention.

FIG. 9 illustrates an example of a driving signal generating circuit 40 applied to the semiconductor memory device according to the embodiment of the present invention. Referring to FIG. 9, the driving signal generating circuit 40 for providing a sub-word line driving signal PXID to a corresponding sub-word line driver 36 includes a driving input terminal NIDR, a driving output terminal NODR, a first inverter 910, a second inverter 920, a driving pull-up unit 930, a first driving pull-down unit 940, a second driving pull-down unit 950 and a driving control unit 960.

A lower decoding signal PXI is input through the driving input terminal NIDR. The sub-word line driving signal PXID is output through the driving output terminal NODR.

The first and second inverters 910 and 920 receive the lower decoding signal PXI. The PMOS transistor 910a of the first inverter 910 has a source terminal connected to the boosting voltage VPP, and the NMOS transistor 910b of the first inverter 910 has a source terminal connected to the ground voltage VSS. Therefore, the output signal N914 of the first inverter 910 swings between the boosting voltage VPP and the ground voltage VSS according to the logic state of the lower decoding signal PXI.

The driving pull-up unit 930 pulls up the driving output terminal NODR to the boosting voltage VPP in response to the output signal N914 of the first inverter 910. Preferably, the driving pull-up unit 930 includes a PMOS transistor 930a that is connected between the boosting voltage VPP and the driving output terminal NODR and is gated by the output signal N914 of the first inverter 910.

The first driving pull-down unit 940 pulls down the driving output terminal NODR to the ground voltage VSS in response to the output signal N914 of the first inverter 910 and the signal of the driving output terminal NODR. Preferably, the first driving pull-down unit 940 includes two NMOS transistors 940a and 940b connected between the ground voltage VSS and the driving output terminal NODR. The NMOS transistor 940a is gated by the output signal N914 of the first inverter 910. The NMOS transistor 940b is gated by a signal PXIDG, formed by delaying the signal of the driving output terminal NODR using a delay circuit 945. The first driving pull-down unit 940 forms a first driving current path IDR1 between the driving output terminal NODR and the ground voltage VSS in response to the output signal N914 of the first inverter 910, that is, the lower decoding signal PXI, and the signal of the driving output terminal NODR.

The second driving pull-down unit 950 pulls down the driving output terminal NODR to the negative voltage VBB in response to a predetermined driving control signal DRCON. Preferably, the second driving pull-down unit 950 includes an NMOS transistor 950a that is connected between the driving output terminal NODR and the negative voltage VBB and is gated by the driving control signal DRCON. In the present embodiment, the driving control signal DRCON is equal to the output signal PXIB of the second inverter 920. The second driving pull-down unit 950 forms a second driving current path IDR2 between the driving output terminal NODR and the negative voltage VBB in response to the driving control signal DRCON.

The driving control unit 960 adjusts the driving control signal DRCON to the negative voltage VBB in response to the pull-up of the driving output terminal NODR. In this way, leakage current caused by the second driving pull-down unit 950 is prevented by the driving control signal DRCON adjusted to the negative voltage VBB.

Preferably, the driving control unit 960 includes an NMOS transistor 960a that is connected between the driving control signal DRCON and the negative voltage VBB and is gated by the driving output terminal NODR.

An NMOS transistor 925 is gated by a signal PXIBG, formed by delaying the driving control signal DRCON using a delay circuit 965, and forms a pull-down path of the inverter 920.

Even after the sub-word line driving signal PXID and the driving control signal DRCON decrease to the threshold voltage of the NMOS transistors 940b and 925 or less, the driving output terminal NODR can be continuously pulled down to the ground voltage VSS for a certain period of time by the delay circuits 945 and 965.

Figure 10:
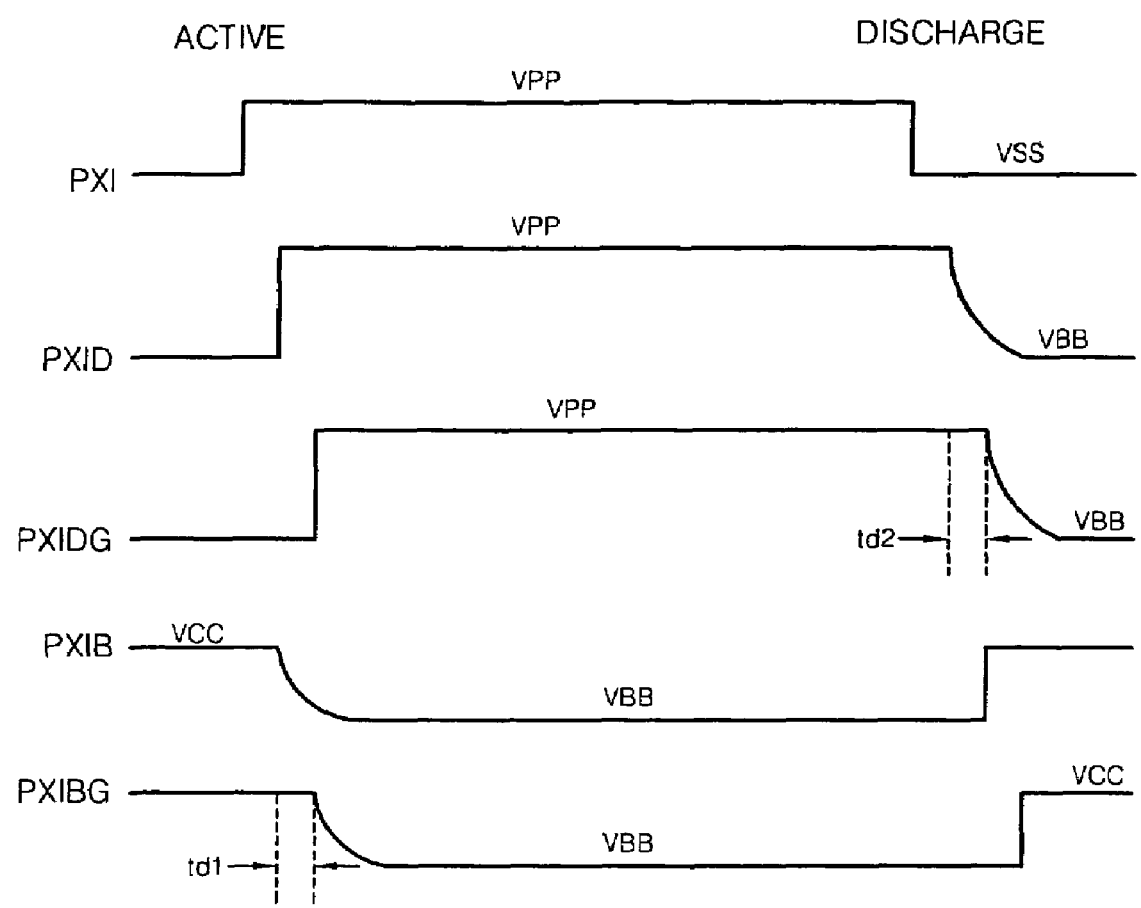
FIG. 10 is a timing diagram of the driving signal generating circuit of FIG. 9.

FIG. 10 is a timing diagram of the driving signal generating circuit 40 of FIG. 9. With reference to FIGS. 3, 4, 9 and 10, the operation of the driving signal generating circuit 40 is described in detail.

If the lower decoding signal PXI makes the transition from the ground voltage VSS to the boosting voltage VPP, the sub-word line driving signal PXID makes the transition from the negative voltage VBB to the boosting voltage VPP through the use of the inverters 910, 920 and 930. Therefore, the sub-word line WL of the sub-word line driver 36 of FIG. 3 or 4 is pulled up to the boosting voltage VPP in response to an activated word line enable signal WEI and deactivated PXIB. In this case, since the transistor 960a is turned on, the driving control signal DRCON is adjusted to the negative voltage VBB. Therefore, leakage current caused by the transistor 950a does not occur.

In this case, the NMOS transistor 925 is gated by the signal PXIBG formed by delaying the signal PXIB by a first delay time td1. The reason for this is to provide sufficient time to pull down the signal PXIB to the ground voltage VSS.

If the lower decoding signal PXI makes the transition from the boosting voltage VPP to the ground voltage VSS, the sub-word line driving signal PXID is decreased to the ground voltage VSS by the transistors 940a and 940b. Further, since the driving control signal DRCON is adjusted to the supply voltage VCC, the sub-word line driving signal PXID is decreased to the negative voltage VBB by the transistor 950a.

Further, the NMOS transistor 940b is gated by the signal PXIDG, formed by delaying the sub-word line driving signal PXID by a second delay time td2. The reason for this is to provide sufficient time to pull down the sub-word line driving signal PXID to the ground voltage VSS.

Figure 11:
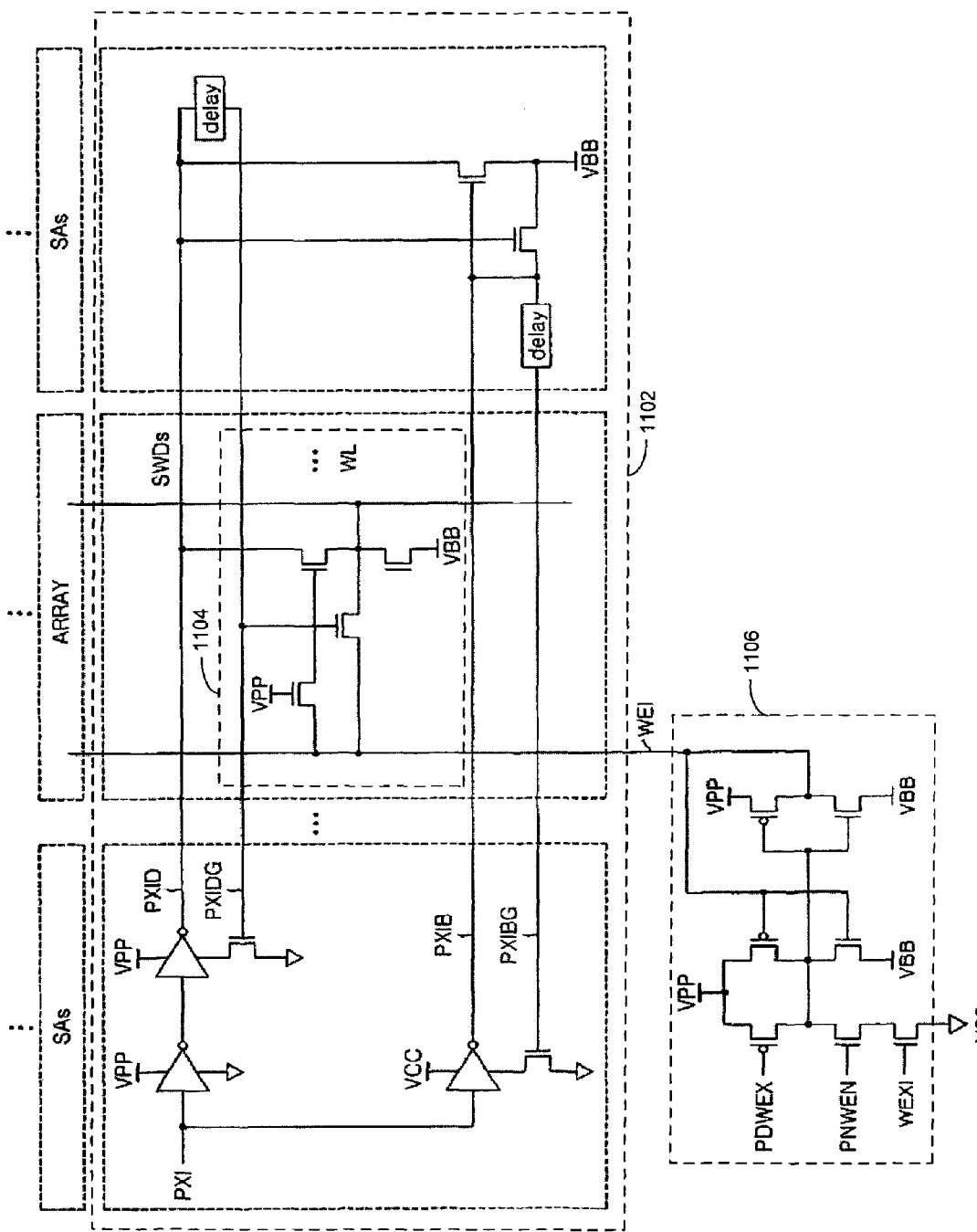
FIGS. 11 and 12 illustrate the arrangement of a sub-word line driver, the driving signal generating circuit and the word line enable driver in the semiconductor memory device of an embodiment of the present invention, in which an NMOS-type sub-word line driver is applied to FIG. 11, and a CMOS-type sub-word line driver is applied to FIG. 12.
Figure 12:
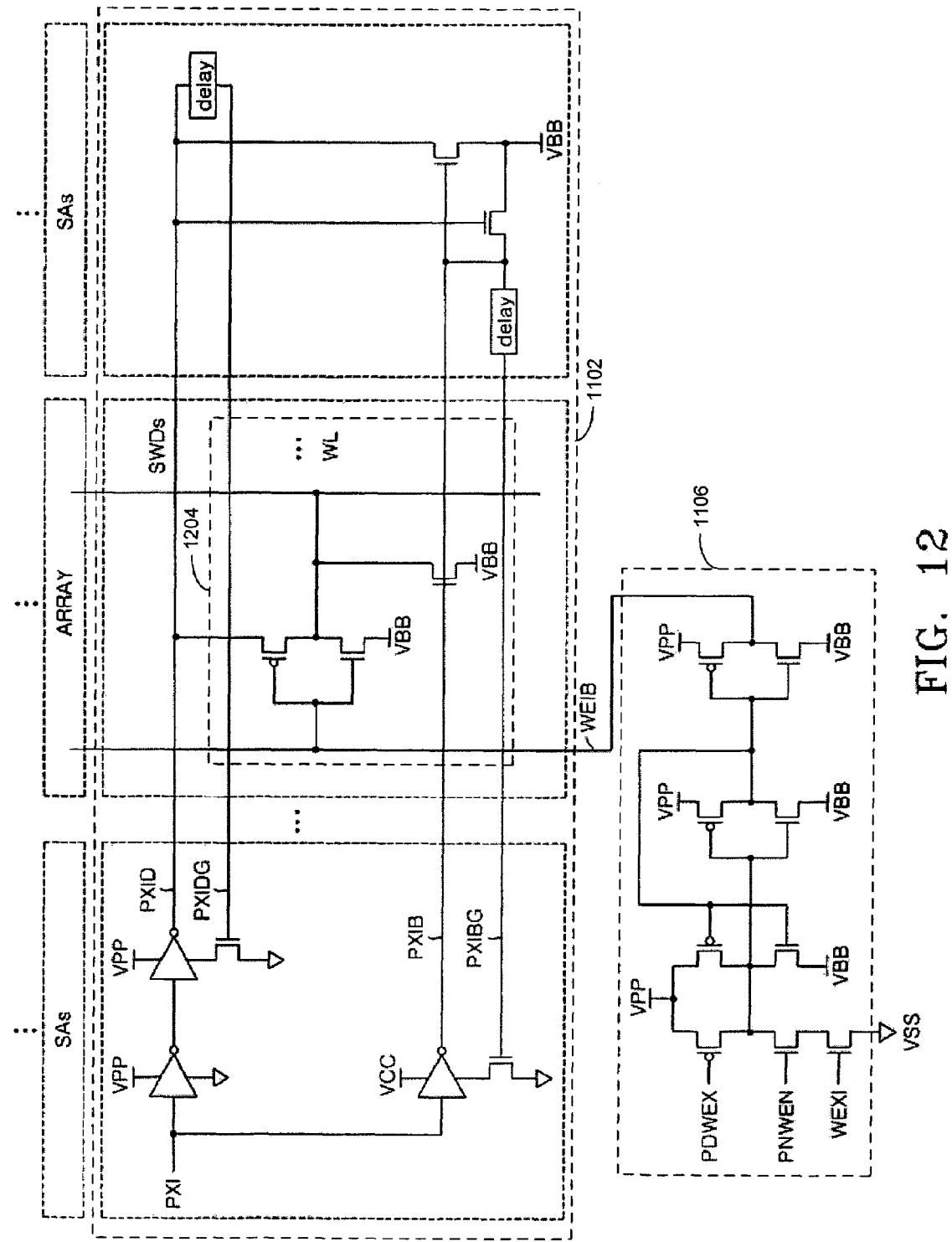

FIGS. 11 and 12 illustrate the arrangement of the sub-word line driver, the driving signal generating circuit and the word line enable driver in the semiconductor memory device of the present invention. In particular, the circuit arrangement of FIG. 11 includes a plurality of NMOS type sub-word line drivers 1104, which correspond to the NMOS type sub-word line driver 36 shown in FIG. 3, in the memory cell array, a plurality of driving signal generating circuits 1102, which correspond to the driving signal generating circuit 40 of FIG. 9, and a word line enable driver 1106, which corresponds to the word line enable driver 39 of FIG. 7. The feature labels shown in FIG. 11 correspond the same named feature labels in FIGS. 3, 7, and 9, the description of which is incorporated herein by reference. The circuit arrangement of FIG. 12 includes a plurality of CMOS type sub-word line drivers 1204, which correspond to the CMOS type sub-word line driver 36 shown in FIG. 4, in the memory cell array, a plurality of driving signal generating circuits 1102, which correspond to the driving signal generating circuit 40 of FIG. 9, and a word line enable driver 1106, which corresponds to the word line enable driver 39 of FIG. 7. The feature labels shown in FIG. 12 correspond the same named feature labels in the FIGS. 4, 7, and 9, the description of which is incorporated herein by reference. As shown in FIGS. 11 and 12, respective components of the driving signal generating circuit 1102 are distributed on both sides of sub-word line blocks SWDs, thus providing an efficient layout.

As described above, the present invention provides a semiconductor memory device, in which NMOS transistors for pulling down a word line enable signal and a word line driving signal to a negative voltage are adjusted to the negative voltage. Therefore, according to the semiconductor memory device of the present invention, the influx of discharge current into a negative voltage source decreases in a negatively biased word line scheme. Accordingly, the present invention is advantageous in that noise occurring due to fluctuations in a negative voltage remarkably decreases.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device, comprising:
a plurality of sub-word lines;
a plurality of sub-word line drivers each connected to corresponding sub-word lines, the sub-word line drivers connecting the corresponding sub-word lines to a first voltage in response to corresponding word line enable signals and sub-word line driving signals during a precharge operation;
a plurality of driving signal generating circuits each connected to a corresponding sub-word line driver and configured to provide the sub-word line driving signals thereto; and
word line enable drivers each connected to a corresponding sub-word line driver and configured to provide the word line enable signals thereto,
wherein each of the word line enable drivers comprises:
a decoder input terminal configured to receive an upper decoding signal;
a decoder control terminal;
a first decoder pull-down unit configured to pull down the decoder control terminal to a second voltage in response to the upper decoding signal and a predetermined leakage interruption signal;
a second decoder pull-down unit configured to pull down the decoder control terminal to the first voltage in response to a preliminary signal that is used to generate the word line enable signals;
a decoder pull-up unit configured to pull up the decoder control terminal in response to the upper decoding signal; and
a driving unit configured to generate the preliminary signal pulled down to the first voltage in response to voltage of the decoder control terminal,
wherein the leakage interruption signal is adjusted to the first voltage when each word line enable signal is activated.

2. The semiconductor memory device according to claim 1, wherein each of the word line enable drivers further comprises a pull-up maintaining unit configured to maintain pull-up voltage of the decoder control terminal in response to the preliminary signal.

3. The semiconductor memory device according to claim 1, wherein the first voltage is lower than the second voltage.

4. The semiconductor memory device according to claim 1, wherein the first voltage is a negative voltage and the second voltage is a ground voltage.

5. A semiconductor memory device, comprising:
a plurality of sub-word lines;
a plurality of sub-word line drivers each connected to corresponding sub-word lines, the sub-word lines, the sub-word line drivers connecting the corresponding sub-word lines to a first voltage in response to corresponding word line enable signals and sub-word line driving signals during a precharge operation;
a plurality of driving signal generating circuits each connected to a corresponding sub-word line driver and configured to provide the sub-word line driving signals thereto; and
word line enable drivers each connected to a corresponding sub-word line driver and configured to provide the word line enable signals thereto,
wherein each of the word line enable drivers comprises:
a decoder input terminal configured to receive an upper decoding signal;
a decoder control terminal;
a first decoder current path formed between the decoder control terminal and the second voltage in response to the upper decoding signal and a leakage interruption signal; and
a second decoder current path formed between the decoder control terminal and the first voltage in response to a preliminary signal that is pulled down to the first voltage in response to voltage of the decoder control terminal,
wherein the leakage interruption signal is adjusted to the first voltage when each word line enable signal is activated.

6. The semiconductor memory device according to claim 5, wherein the first voltage is a negative voltage and the second voltage is a ground voltage.

7. A method of driving a semiconductor memory device including at least one sub-word line driver configured to connect a corresponding sub-word line to a first voltage in response to a word line enable signal and a sub-word line driving signal, the method comprising:
generating by a driving signal generating circuit the sub-word line driving signal and providing the sub-word line driving signal to a corresponding sub-word line driver through a driving output terminal, the driving signal generating circuit having a driving input terminal and the driving output terminal; and
generating by a word line enable driver a pulled down word line enable signal in response to a decoder control terminal and providing the word line enable signal to the corresponding sub-word line driver, the word line enable driver having a decoder input terminal and the decoder control terminal,
wherein generating by a driving signal generating circuit comprises:
receiving an upper decoding signal through the decoder input terminal;
pulling down the decoder control terminal to a second voltage in response to the upper decoding signal and a leakage interruption signal, and pulling down the decoder control terminal to the first voltage in response to a preliminary signal that is used to generate the word line enable signal; and
generating the preliminary signal pulled down to the first voltage in response to voltage of the decoder control terminal,
wherein the leakage interruption signal is adjusted to the first voltage when the word line enable signal is activated.

8. The method according to claim 7, wherein the first voltage is a negative voltage and the second voltage is a ground voltage.

9. A method of driving a semiconductor memory device including at least one sub-word line driver configured to connect a corresponding sub-word line to a first voltage in response to a word line enable signal and a sub-word line driving signal, the method comprising:
generating by a driving signal generating circuit the sub-word line driving signal and providing the sub-word line driving signal to a corresponding sub-word line driver through a driving output terminal, the driving signal generating circuit having a driving input terminal and the driving output terminal; and
generating by a word line enable driver a pulled down word line enable signal in response to a decoder control terminal and providing the word line enable signal to the corresponding sub-word line driver, the word line enable driver having a decoder input terminal and the decoder control terminal, wherein generating by a driving signal generating circuit comprises:

receiving an upper decoding signal through the decoder input terminal;

forming a first decoder current path between the decoder control terminal and a second voltage in response to the upper decoding signal and a leakage interruption signal;

forming a second decoder current path between the decoder control terminal and the first voltage in response to a preliminary signal that is used to generate the word line enable signal; and pulling down the preliminary signal to the first voltage in response to voltage of the decoder control terminal;

wherein the leakage interruption signal is adjusted to the first voltage when the word line enable signal is activated.

10. The method according to claim 9, wherein the first voltage is a negative voltage and the second voltage is a ground voltage.

11. A semiconductor memory device, comprising:

a plurality of sub-word lines;

a plurality of sub-word line drivers each connected to corresponding sub-word lines, the sub-word lines, the sub-word line drivers connecting the corresponding sub-word lines to a first voltage in response to corresponding word line enable signals and sub-word line driving signals during a precharge operation;

a plurality of driving signal generating circuits each connected to a corresponding sub-word line driver and configured to provide the sub-word line driving signals thereto; and word line enable drivers each connected to a corresponding sub-word line driver and configured to provide the word line enable signals thereto, wherein each of the driving signal generating circuits comprises:

a driving input terminal connected to receive a lower decoding signal, a driving output terminal connected to output a corresponding sub-word line driving signal;

a first driving pull-down unit connected to the driving output terminal and configured to pull down the driving output terminal to a second voltage in response to the lower decoding signal;

a second driving pull-down unit configured to pull down the driving output terminal to the first voltage in response to a driving control signal that responds to the lower decoding signal; and a driving control unit configured to adjust the driving control signal to the first voltage in response to pull-up of the driving output terminal so as to at least substantially inhibit leakage current caused by the second driving pull-down unit.

12. The semiconductor memory device according to claim 11, wherein the first voltage is lower than the second voltage.

13. The semiconductor memory device according to claim 11, wherein the first voltage is a negative voltage and the second voltage is a ground voltage.

14. The semiconductor memory device according to claim 11, wherein:

the second driving pull-down unit comprises a first NMOS transistor that is connected between the driving output terminal and the first voltage and is gated by the driving control signal; and the driving control unit comprises a second NMOS transistor that is connected between the driving control signal and the first voltage and responds to the driving output terminal.

15. A semiconductor memory device, comprising:

a plurality of sub-word lines;

a plurality of sub-word line drivers each connected to corresponding sub-word lines, the sub-word lines, the sub-word line drivers connecting the corresponding sub-word lines to a first voltage in response to corresponding word line enable signals and sub-word line driving signals during a precharge operation;

a plurality of driving signal generating circuits each connected to a corresponding sub-word line driver and configured to provide the sub-word line driving signals thereto; and word line enable drivers each connected to a corresponding sub-word line driver and configured to provide the word line enable signals thereto, wherein each of the driving signal generating circuits comprises:

a driving input terminal connected to receive a lower decoding signal, a driving output terminal connected to output a corresponding sub-word line driving signal;

a first driving current path formed between the driving output terminal and the second voltage in response to the lower decoding signal;

a second driving current path formed between the driving output terminal and the first voltage in response to a driving control signal that responds to the lower decoding signal; and a driving control unit configured to adjust the driving control signal to the first voltage in response to pull-up of the driving output terminal so as to at least substantially inhibit leakage current caused by the second driving current path.

16. The semiconductor memory device according to claim 15, wherein the first voltage is a negative voltage and the second voltage is a ground voltage.

17. A semiconductor memory device, comprising:

a plurality of sub-word lines;

a plurality of sub-word line drivers each connected to corresponding sub-word lines, the sub-word line drivers connecting the corresponding sub-word lines to a first voltage in response to corresponding word line enable signals and sub-word line driving signals during a precharge operation;

a plurality of driving signal generating circuits each connected to a corresponding sub-word line driver and configured to provide the sub-word line driving signals thereto; and word line enable drivers each connected to a corresponding sub-word line driver and configured to provide the word line enable signals thereto, wherein each of the driving signal generating circuits comprises:

a driving input terminal connected to receive a lower decoding signal;

a driving output terminal connected to output a corresponding sub-word line driving signal;

a first inverter connected to receive the lower decoding signal and configured to output an inverted signal therefrom;

a second inverter connected to receive the lower decoding signal and configured to output an inverted signal therefrom;

a driving pull-up unit configured to pull up the driving output terminal to a boosting voltage in response to the output signal of the first inverter;

a first driving pull-down unit configured to pull down the driving output terminal to a second voltage in response to the output signal of the first inverter and a signal of the driving output terminal;

a second driving pull-down unit configured to pull down the driving output terminal to the first voltage in response to a driving control signal that responds to the output signal of the second inverter; and a driving control unit configured to adjust the driving control signal to the first voltage in response to pull-up of the driving output terminal so as to at least substantially inhibit leakage current caused by the second driving pull-down unit.

18. The semiconductor memory device according to claim 17, wherein the first voltage is a negative voltage and the second voltage is a ground voltage.

19. The semiconductor memory device according to claim 17, wherein:

the second driving pull-down unit comprises a first NMOS transistor that is connected between the driving output terminal and the first voltage and is gated by the driving control signal; and the driving control unit comprises a second NMOS transistor that is connected between the driving control signal and the first voltage and responds to the driving output terminal.

20. A method of driving a semiconductor memory device including at least one sub-word line driver configured to connect a corresponding sub-word line to a first voltage in response to a word line enable signal and a sub-word line driving signal, the method comprising:

generating by a driving signal generating circuit the sub-word line driving signal and providing the sub-word line driving signal to a corresponding sub-word line driver through a driving output terminal, the driving signal generating circuit having a driving input terminal and the driving output terminal; and generating by a word line enable driver a pulled down word line enable signal in response to a decoder control terminal and providing the word line enable signal to the corresponding sub-word line driver, the word line enable driver having a decoder input terminal and the decoder control terminal, wherein generating by a driving signal generating circuit comprises:

receiving a lower decoding signal;

pulling down the sub-word line driving signal to a second voltage in response to the lower decoding signal; and pulling down the sub-word line driving signal to the first voltage in response to a predetermined driving control signal, wherein the driving control signal is adjusted to the first voltage in response to pull-up of the driving output terminal.

21. The method according to claim 20, wherein the first voltage is a negative voltage and the second voltage is a ground voltage.

22. A method of driving a semiconductor memory device including at least one sub-word line driver configured to connect a corresponding sub-word line to a first voltage in response to a word line enable signal and a sub-word line driving signal, the method comprising:

generating by a driving signal generating circuit the sub-word line driving signal and providing the sub-word line driving signal to a corresponding sub-word line driver through a driving output terminal, the driving signal generating circuit having a driving input terminal and the driving output terminal; and generating by a word line enable driver a pulled down word line enable signal in response to a decoder control terminal and providing the word line enable signal to the corresponding sub-word line driver, the word line enable driver having a decoder input terminal and the decoder control terminal, wherein generating by a driving signal generating circuit comprises:

receiving a lower decoding signal through the driving input terminal;

forming a first driving current path between the driving output terminal and a second voltage in response to the lower decoding signal; and forming a second driving current path between the driving output terminal and the first voltage in response to a predetermined driving control signal, wherein the driving control signal is adjusted to the first voltage in response to pull-up of the driving output terminal.

23. The method according to claim 22, wherein the first voltage is a negative voltage and the second voltage is a ground voltage.

* * * * *

UNITED STATES PATENT AND TRADEMARK OFFICE
CERTIFICATE OF CORRECTION

PATENT NO. : 7,248,535 B2  Page 1 of 1
APPLICATION NO. : 11/344018
DATED : July 24, 2007
INVENTOR(S) : Chun It is certified that error appears in the above-identified patent and that said Letters Patent is hereby corrected as shown below:

In The Claims:

Column 13, Claim 11:  Please correct line 28:
        "corresponding sub-word lines, the sub-word lines, the"
   To read: --corresponding sub-word lines, the--

Signed and Sealed this

Twenty-third Day of October, 2007

JON W. DUDAS
*Director of the United States Patent and Trademark Office*